United States Patent [19]
Washio et al.

[11] Patent Number: 5,424,575
[45] Date of Patent: Jun. 13, 1995

[54] SEMICONDUCTOR DEVICE FOR SOI STRUCTURE HAVING LEAD CONDUCTOR SUITABLE FOR FINE PATTERNING

[75] Inventors: Katsuyoshi Washio, Tokorozawa; Tohru Nakamura, Mitaka; Takahiro Onai, Ome; Masatada Horiuchi, Koganei; Takashi Uchino, Kokubunji, all of Japan

[73] Assignee: Hitachi, Ltd., Tokyo, Japan

[21] Appl. No.: 890,787

[22] Filed: Jun. 1, 1992

[30] Foreign Application Priority Data

Jun. 3, 1991 [JP] Japan .................. 3-130977

[51] Int. Cl.$^6$ .................. H01L 29/72; H01L 27/12
[52] U.S. Cl. .................. 257/526; 257/557; 257/754; 257/559
[58] Field of Search .................. 257/526, 666, 754, 559, 257/557, 558; 437/84, 32, 33, 51; 365/174, 178

[56] References Cited
U.S. PATENT DOCUMENTS 3,598,664  8/1971  Kilby .................. 257/526
4,404,658  9/1983  Ports .................. 257/526
4,897,698  1/1990  Zorinsky et al. .................. 257/526
5,298,786  3/1994  Shahid et al. .................. 257/559

*Primary Examiner*—Mark V. Prenty
*Assistant Examiner*—D. Monin
*Attorney, Agent, or Firm*—Antonelli, Terry, Stout & Kraus

[57] ABSTRACT

A semiconductor device has an electrically insulating substrate and a semiconductor layer formed on the insulating substrate. A plurality of semiconductor regions are defined so as to be joined to each other to form at least two homojunctions in the semiconductor layer. A lead conductor for one of the semiconductor regions which is required to have a small thickness has a specific structure such that the lead conductor is in contact with the one semiconductor region at the main surface of the semiconductor layer for electrical connection therebetween and extends over that portion of the semiconductor layer which contributes to definition of at least one of the semiconductor regions other than the first-mentioned one semiconductor region.

22 Claims, 8 Drawing Sheets

SEMICONDUCTOR DEVICE FOR SOI STRUCTURE HAVING LEAD CONDUCTOR SUITABLE FOR FINE PATTERNING

BACKGROUND OF THE INVENTION

The present invention relates to a semiconductor device of Silicon On Insulator (SOI) structure in which a soft error is hard to be produced.

An example of the conventional semiconductor device is set forth in JP-A-2-90535 (laid open on Mar. 30, 1990). A bipolar transistor disclosed therein is a lateral bipolar transistor of a Silicon-On-Insulator (SOI) structure, and has a sectional structure similar to that shown in FIG. 1. Namely, an n-type emitter region 311, a p-type base region 312, an n-type collector region 313, and an n-type collector lead region 314 of a high concentration are provided on an insulating substrate 100 so as to reduce parasitic capacitance and aim at a high speed. In this transistor structure, an island including regions 311, 312, 313 and 314 is formed, and separation among elements can be realized easily by arranging islands so as to separate them from one another on the insulating substrate.

Figure 1:
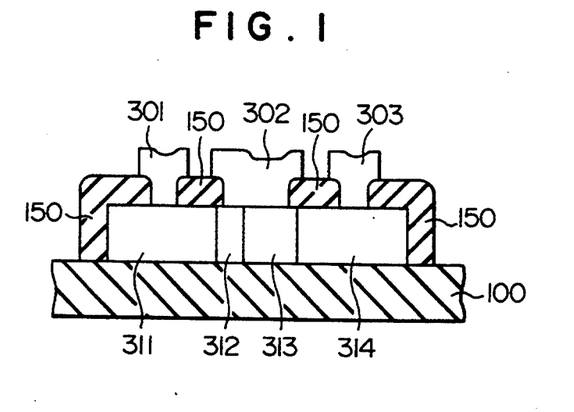
FIG. 1 is a sectional view showing an example of the conventional semiconductor device.

In a device shown in FIG. 1, however, an emitter electrode 301, a base electrode 302 and a collector electrode 303 are formed so as to cover opening portions in a silicon oxide film 150 provided on the n-type emitter region 311, the p-type base region 312 and the n-type collector lead region 314 of high concentration, respectively. Therefore, mask alignment tolerance between respective regions and opening portions and mask alignment tolerance between opening portions and electrodes are required, and an influence by electrode processing dimensions (line width and space) is also exerted. As a result, it has been impossible to perform fine patterning of above-mentioned electrode pattern (301, 302, 303) and the like. Thus, it has been difficult to miniaturize a transistor. Moreover, it has been difficult to reduce widths of the n-type emitter region 311, the n-type collector region 313 and the n-type collector lead region 314 of high concentration because of similar reasons, which prevents operation at a high speed.

SUMMARY OF THE INVENTION

It is an object of the present invention to provide a semiconductor device which can be formed in a fine structure and is thus capable of operation at a high speed.

According to one aspect of the present invention, a semiconductor device has an electrically insulating substrate and a semiconductor layer formed on the insulating substrate in which a plurality of semiconductor regions are defined so as to be joined to each other to form at least two homojunctions, the junctions generally extend in a direction perpendicular to the insulating substrate and terminate at a main surface of the semiconductor layer, and the plurality of semiconductor regions constitute the main surface of the semiconductor layer, wherein a lead conductor is provided so as to be in contact with one of the semiconductor regions at the main surface of the semiconductor layer for electrical connection therebetween and extending over that portion of the semiconductor layer which contributes to definition of at least one of the semiconductor regions other than the above-mentioned semiconductor region.

According to the above-mentioned one aspect of the present invention, the lead conductor connected to one semiconductor region is formed extending mainly over a part of the other semiconductor regions. Therefore, the dimensions of the lead conductor are not restricted by the dimensions and shapes of above-mentioned other semiconductor regions, and the lead conductor can be provided having free dimensions. As a result, it is possible to form a semiconductor device in a fine structure. Further, since the widths of respective semiconductor regions can be set small, it is possible to aim at high speed operation of a semiconductor device. Further, when the widths of these semiconductor regions are set large, it is possible to aim at high breakdown voltage of a transistor. Furthermore, since these widths can be set freely, it is possible to form variety of transistors having different characteristics at need in an integrated circuit inclusively on the same chip easily.

BRIEF DESCRIPTION OF THE DRAWINGS

FIG. 2B is a plan view of the device shown in FIG. 2A, and FIG. 2A shows a section taken along a line IIA—IIA in FIG. 2B.

FIG. 13B is a plan view of the device shown in FIG. 13A, and FIG. 13A is a section taken along a line XIIIA—XIIIA in FIG. 13B.

DESCRIPTION OF THE PREFERRED EMBODIMENTS

Figure 2A:
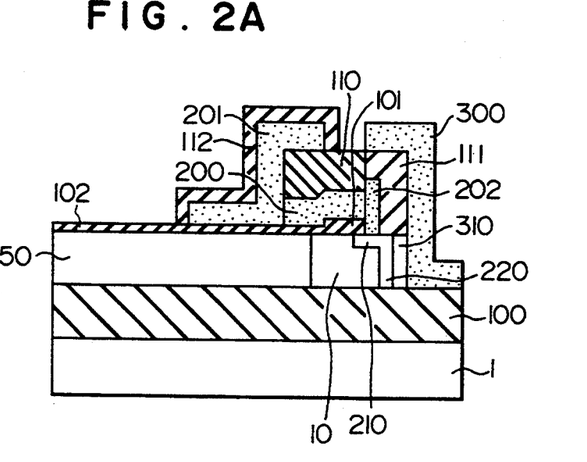
FIG. 2A is a sectional view of a semiconductor device according to Embodiment 1 of the present invention.
Figure 2B:
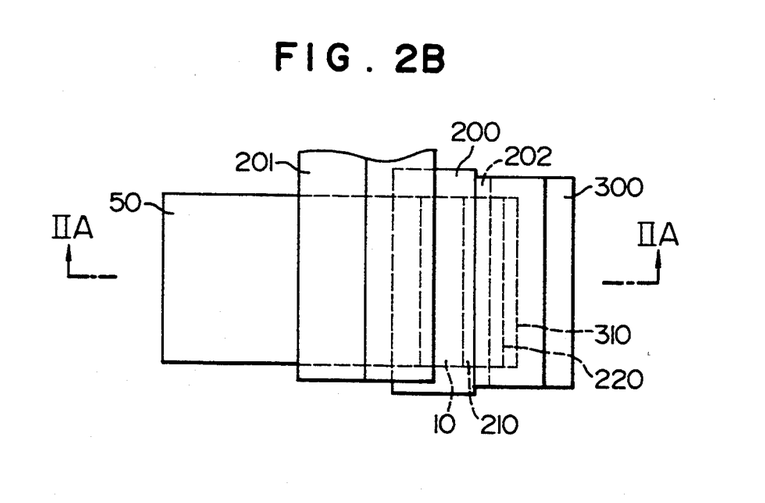

FIGS. 2A and 2B are sectional and plan views of a semiconductor device according to Embodiment 1 of the present invention. The present embodiment shows an example of a bipolar transistor. A single-crystal semiconductor layer defining single-crystal semiconductor regions 310, 220, 10 and 50 is formed on an insulating film 100. In the semiconductor region 220, an expanded area in a surface portion of the semiconductor layer, i.e., a p-type high impurity concentration region 210 formed by diffusion from a polycrystalline semiconductor layer 202 with impurities added thereto in advance is provided. A lead electrode for the p-type single-crystal semiconductor region 220 is formed by means of polycrystalline semiconductor layers 202, 200 and 201 through the p-type high impurity concentration region 210. Further, in the n-type single-crystal semiconductor region 50 of a high impurity concentration, a portion of the region 50 adjacent to the n-type single-crystal semiconductor region 10 acts as a collector region of a high impurity concentration. In FIG. 2A, a portion of the n-type single-crystal semiconductor region 50 having a high impurity concentration which underlies the polycrystalline semiconductor layer 201 and another portion of the region 50 which is located to the left of the first-mentioned portion form a lead region (lead conductor) for the collector region. Furthermore, a polycrystalline semiconductor layer 300 is connected to a side of an n-type single-crystal semiconductor region 310 of a high impurity concentration, which forms a lead region (lead conductor) for the region 310.

In the present embodiment, principal parts of the polycrystalline semiconductor layers 202, 200 and 201 are provided extending over the single-crystal regions 10 and 50. Accordingly, even if the width of the single-crystal semiconductor region 220 is formed small, no restrictions are imposed on electrode outlet for the region 220. Further, since the polycrystalline semiconductor layer 300 is connected to the side of the n-type single-crystal semiconductor region 310 of a high impurity concentration as described above, even if the width of the single-crystal semiconductor region 310 is formed small, no restrictions are imposed on electrode outlet of the region 310.

Accordingly, all of the regions other than the single-crystal semiconductor regions 310, 220, 210 and 10 which become active regions of a transistor serve as interconnection regions, thus taking such an effect that the effective transistor area can be formed in a fine structure. As an example, when it is assumed that the width of the emitter region 310, the width of the intrinsic base region 220, the width of the collector region 10 of a low impurity concentration and the width of the collector region 50 of a high impurity concentration required at the minimum are 0.05 $\mu$m, 0.05 $\mu$m, 0.1 $\mu$m and 0.1 $\mu$m, respectively, the width of the effective transistor area will be decreased to as small a width as 0.3 $\mu$m. When the length in the depth direction of a transistor is assumed to be approximately 3 $\mu$m, the effective transistor area will be miniaturized to approximately 1 $\mu$m$^2$.

Further, in one aspect of the present invention, it is possible to set the width of the collector region 10 of a low impurity concentration freely for each individual transistor in accordance with plane pattern dimensions as described later. Thus, an effect is produced such that a transistor of a high breakdown voltage can be formed easily if the width of the region 10 is made larger. Thus, a variety of transistors including those having a high speed and a low breakdown voltage and those having a middle speed and a high breakdown voltage in accordance with a need of an integrated circuit can be formed integrally, which was impossible with the conventional techniques unless a special process is employed. Furthermore, it is possible to realize a bipolar transistor which suffers a reduced amount of noise charges collected when radiation such as $\alpha$ rays is emitted thereto and which less suffers soft errors, owing to fact that active regions of the transistor are miniaturized.

Figure 3:
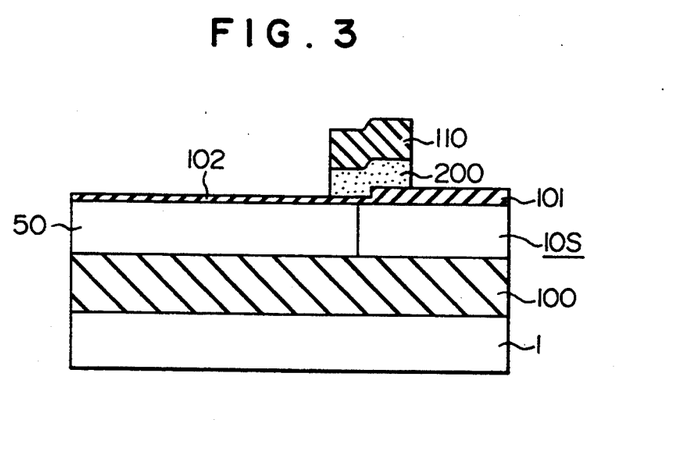
FIG. 3 to FIG. 5 are sectional views of a device at respective manufacturing stages in a semiconductor device manufacturing process of Embodiment 1.
Figure 4:
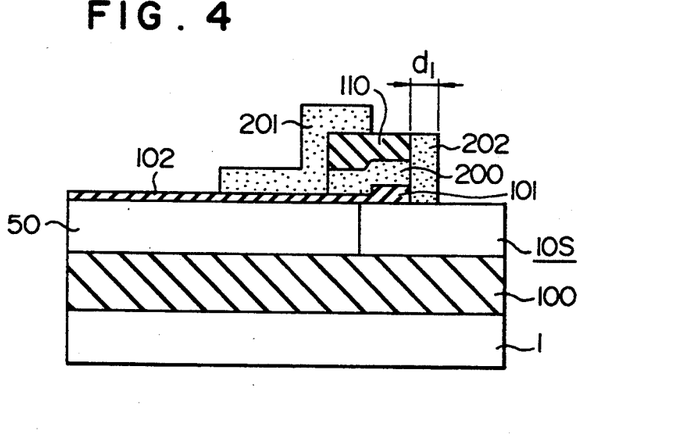
Figure 5:
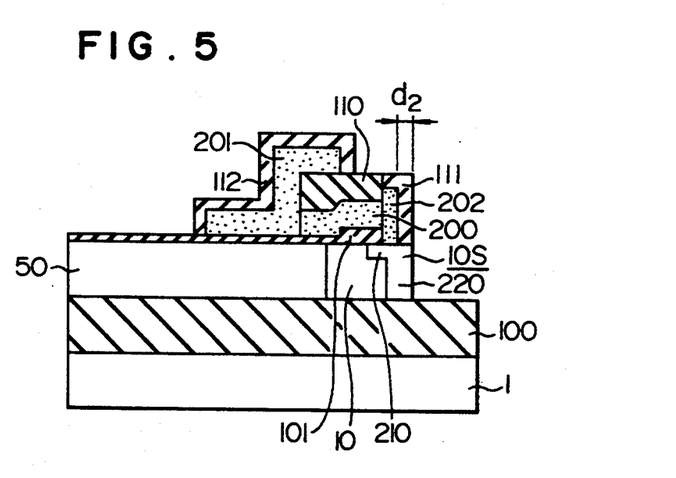

FIG. 3 to FIG. 5 are sectional views showing a manufacturing process of Embodiment 1 shown in FIGS. 2A and 2B. The manufacturing process will be described hereinafter in accordance with the drawing number.

FIG. 3: An n-type silicon (Si) substrate 10S with a silicon oxide film 100 formed on the surface thereof is applied to a support substrate 1 by the so-called direct bonding so that the silicon oxide film 100 comes into contact with the surface of the Si support 1. Thereafter, the n-type Si substrate 10S is polished so as to be 3 $\mu$m thick, for example. A silicon oxide film 101 is formed on the whole surface of the substrate 10S by applying thermal oxidation to the substrate 10S, and the silicon oxide film 101 existing at least on a portion of the substrate 10S which will serve as a collector lead region is removed. Then, the substrate 10S is thermally oxidized again so as to form a silicon oxide film 102 which is thinner than the oxide film 101. Thereafter, a polycrystalline silicon layer 200 is deposited on the silicon oxide films 101 and 102, and a p-type impurity is added to (for example, boron ions are implanted into) the layer 200, thus depositing a silicon oxide film 110 on the layer 200. Then, patterning is applied to the layers 110 and 200 so as to remove a portion which will serve as a collector lead region of the substrate 10S and a portion existing on at least a part of the portion which will serve as a collector region. Namely, a part each of the oxide films 102 and 101 and the step between them are covered by the films 110 and 200. Then, an n-type impurity is added (for example, phosphorus ions or arsenic ions are implanted) with photoresist and two-layer films 110 and 200 used as a mask so as to form an n-type region 50 of high concentration operating as a collector lead region.

FIG. 4: The silicon oxide film 101 other than those parts which underlie the two-layer films 110 and 200 is removed with photoresist and the two-layer films 110 and 200 used as a mask. A polycrystalline silicon layer is deposited on the whole surface of the obtained structure including the exposed surface portion of the substrate 10S, and a p-type impurity is added (for example, boron ions are implanted) to the polycrystalline silicon layer. Thereafter, patterning is performed by a photolithographic process and anisotropic etching so as to form p-type polycrystalline silicon layers 201 and 202 shown in the figure. Thus, the p-type polycrystalline silicon layer 202 is connected electrically to the p-type polycrystalline silicon layer 200 on the side face thereof, and is also connected electrically to the n-type single-crystal silicon substrate 10S at the lower part thereof. The width (lateral distance in the figure) of the contact between the polycrystalline silicon layer 202 and the n-type single-crystal silicon substrate 10S is controllable by the film thickness $d_1$ of the deposited polycrystalline silicon layer 202. The polycrystalline silicon layer 201 is connected electrically to the polycrystalline silicon layer 200 in a similar manner.

FIG. 5: Silicon oxide films 112 and 111 are formed by thermal oxidation so as to cover the polycrystalline silicon layers 201 and 202. At this time, the polycrystalline silicon layer 202 is somewhat reduced in thickness by the thermal oxidation. Further, a thin silicon oxide film on the n-type single-crystal silicon substrate 10S formed in the thermal oxidation process simultaneously with the films 112 and 111 is removed selectively, and the unnecessary portion of the n-type single-crystal silicon substrate 10S is removed by etching, using the obtained silicon oxide film as a mask. Thus, the distance (lateral distance in the figure) between the polycrystalline silicon layer 202 which is a lead electrode for the base region and the exposed end face of the n-type single-crystal silicon substrate 10S is determined by the film thickness $d_2$ of the silicon oxide film 111. Then, boron for instance is diffused from the exposed end face of the n-type single-crystal silicon substrate 10S in order to forman intrinsic base region 220.

As a result, the width of the n-type single-crystal silicon layer 10 which serves as the collector region of a low concentration is given by subtracting the sum of a lateral diffusion length of the n-type region 50 of a high concentration, a lateral diffusion length for forming the p-type intrinsic base region 220 and reduced part of the film thickness of the polycrystalline silicon layer 202 by the thermal oxidation from the sum of the width (lateral distance in the figure) of the two layers 110 and 200 formed by patterning shown in FIG. 3, the film thickness $d_1$ of the polycrystalline silicon layer 202 and the film thickness $d_2$ of the silicon oxide film 111. Accordingly, when the width by patterning of the two layers 110 and 200 is determined, other factors of the n-type single-crystal silicon layer 10 which serves as the collector region of a low concentration are determined by controllable process conditions, and thus can be modified freely. A p-type extrinsic base region 210 is formed by diffusion, for 10 minutes at 900° C., for example, from the polycrystalline silicon layer 202 with an n-type impurity (e.g., boron) added thereto in advance, and the p-type intrinsic base region 220 is led out of the polycrystalline silicon layers 202, 200 and 201 through the p-type extrinsic base region 210. The region 210 has, for example, an impurity concentration of $1 \times 10^{19}$ cm$^{-3}$ and a sheet resistance of 30 $\Omega/\square$.

Thereafter, a polycrystalline silicon layer is deposited on the whole surface of the obtained structure, an n-type impurity is added (for example, phosphorus ions are implanted), and patterning is performed so as to form the polycrystalline silicon layer 300 (FIG. 2A) which will serve as a lead electrode for the emitter region. After forming the n-type emitter region 310 of a high concentration by diffusion, for 30 seconds at 1000° C. for example, of the n-type impurity (e.g., arsenic) added to the layer 300 into the substrate 10S, patterning is applied to the polycrystalline silicon layer 300, thereby to form the transistor shown in FIG. 1. The region 310 has, for example, an impurity concentration of $5 \times 10^{20}$ cm$^{-3}$ and a sheet resistance of 30 $\Omega/\square$.

A semiconductor device and a method of manufacturing same according to Embodiment 1 has been described above. According to such manufacturing process, the whole of active regions of a transistor can be formed in a self-alignment manner by a photolithographic process effected only once, and furthermore, connecting conductor layers can also be connected to the active regions of the transistor in a self-alignment manner so as to form the transistor in a fine structure.

Figure 6:
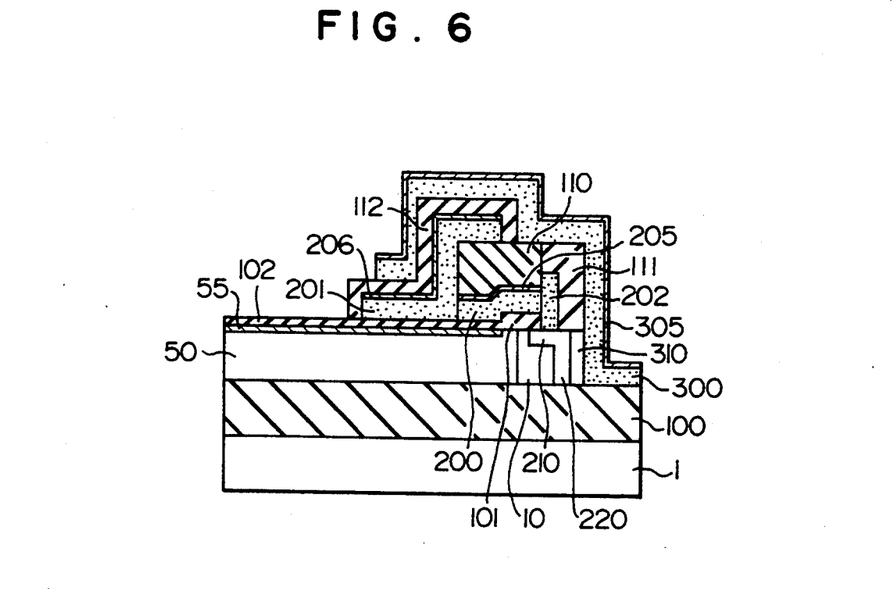
FIG. 6 is a sectional view of a semiconductor device according to Embodiment 2 of the present invention.

FIG. 6 is a sectional view of a semiconductor device according to Embodiment 2 of the present invention. Metallic compounds (such as $WSi_2$ and $TiSi_2$) 55, 205, 206 and 305 are provided on respective surfaces of the n-type region 50 of a high impurity concentration, the p-type polycrystalline silicon layers 200 and 201, and the n-type polycrystalline silicon layer 300. With this structure, respective resistances of leads for electrodes can be reduced, leads can be extended as desired, and the time constant depending on a series resistance can be shortened. As a result, the degree of freedom of element layout is enhanced, thereby to realize a high speed operation. Furthermore, according to the present embodiment, respective lead conductor layers for the collector, the base and the emitter can be laminated as shown in this figure, thus making it possible to provide connecting conductor layers with high degree of freedom of conductor installation and high efficiency. Besides, metallic compounds are provided only on the surfaces of the n-type region 50 of a high impurity concentration, the p-type polycrystalline silicon layers 200 and 202 and the n-type polycrystalline silicon layer 300 in the present embodiment, but all of the region and the layers may be wholly replaced with metallic compounds or metals.

Figure 7:
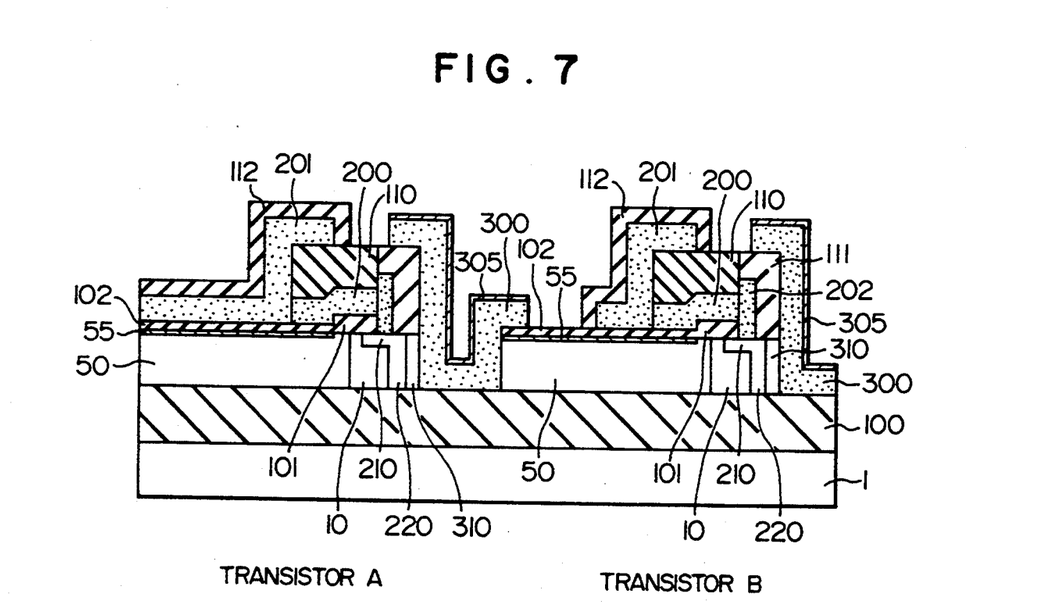
FIG. 7 is a sectional view of a semiconductor device according to Embodiment 3 of the present invention.

FIG. 7 is a sectional view of a semiconductor device according to Embodiment 3 of the present invention. An emitter of a transistor A and a collector of a transistor B are connected directly to each other by connecting an n-type polycrystalline silicon layer 300 and a metallic compound layer 305, which form an emitter lead conductor, with an n-type region 50 of a high impurity concentration and a metallic compound layer 55 which form a collector lead conductor of an adjacent transistor B on one and the same insulating substrate. By forming such a structure, it is possible to eliminate contact holes and aluminum electrode connection layers which have been required in a prior art device, leading to a high integration.

Figure 8:
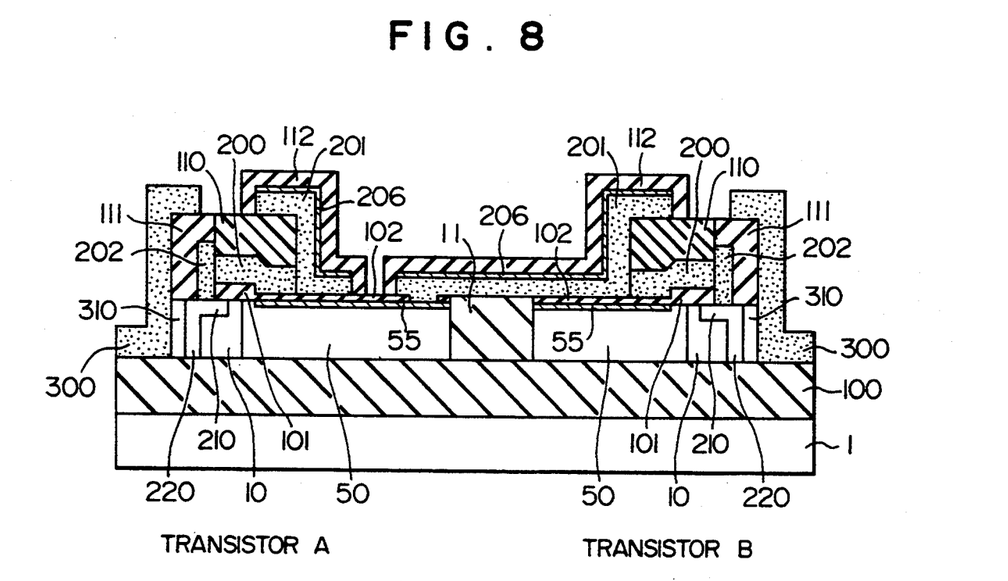
FIG. 8 is a sectional view of a semiconductor device according to Embodiment 4 of the present invention.

FIG. 8 is a sectional view of a semiconductor device according to Embodiment 4 of the present invention. The collector of the transistor A and the base of the transistor B are connected directly to each other by connecting an n-type region 50 of a high impurity concentration and a metallic compound 55, which form a collector lead conductor for the transistor A, with a p-type polycrystalline silicon layer 201 and a metallic compound layer 206 which form a base lead conductor for the adjacent transistor B on one and the same insulating substrate. With such a structure, it is possible to eliminate contact holes and aluminum connection layers which have been required in the prior art device thereby to attain a high integration in a similar manner to Embodiment 3. Incidentally, reference numeral 11 represents an insulating layer (silicon oxide layer).

Figure 9:
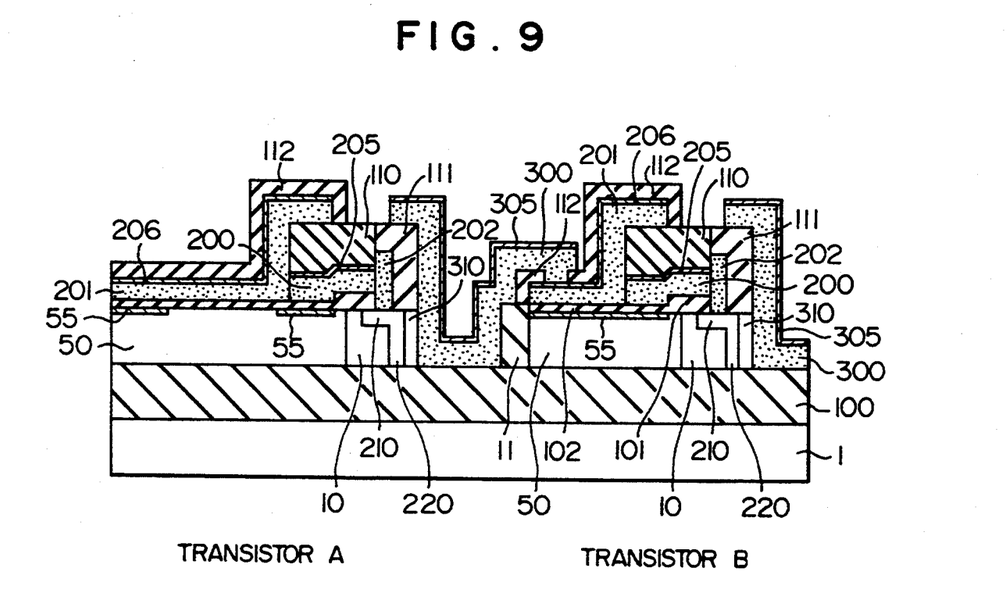
FIG. 9 is a sectional view of a semiconductor device according to Embodiment 5 of the present invention.

FIG. 9 is a sectional view of a semiconductor device according to Embodiment 5 of the present invention. An emitter of a transistor A and a base of a transistor B are connected directly with each other by connecting an n-type polycrystalline silicon layer 300 and a metallic compound 305, which form an emitter lead conductor for the transistor A, with a p-type polycrystalline silicon layer 201 and a metallic compound 206 of the adjacent transistor B on one and the same insulating substrate. With such a structure, it is possible to eliminate contact holes and aluminum connecting conductor layers which have been required in a prior art device so as to attain a high integration in a similar manner to that in Embodiments 3 and 4.

Further, in the present embodiment, the metallic compound layer 55 which is a collector lead conductor for the transistor A is divided or cut half-ways, thereby to form a resistance region where an n-type region 50 of a high impurity concentration having no metallic compound layer 55 on the surface thereof is connected to the collector of the transistor A. With this structure, an independent resistance region is not required to be provided, and contact holes and aluminum connecting conductor layers for connection become unnecessary, thus attaining a high integration. Besides, only direct connection of the resistance to the collector region is shown herein, but direct connection of the resistance is possible by a similar method as to the base region and the emitter region for a high integration.

Figure 10:
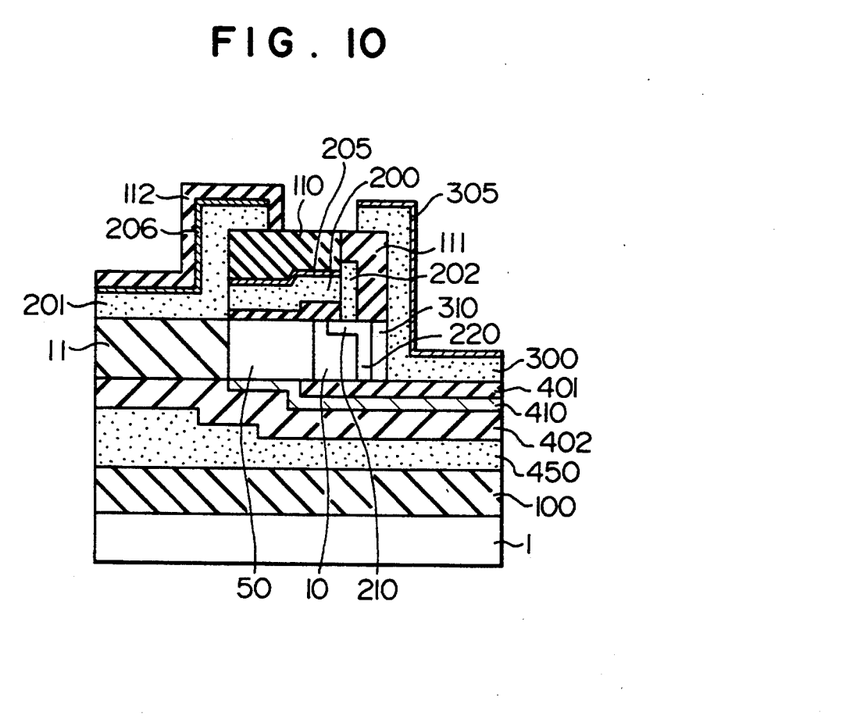
FIG. 10 is a sectional view of a semiconductor device according to Embodiment 6 of the present invention.

FIG. 10 is a sectional view of a semiconductor device according to Embodiment 6 of the present invention. In the present embodiment, an n-type single-crystal semiconductor layer 50 of a high impurity concentration of the collector region is led out from the lower part of the transistor region by means of a metal (e.g., tungsten) or a metallic compound (e.g., tungsten silicide) 410. In this structure, it is possible to miniaturize the device because the collector lead conductor region overlaps the transistor region in a plane. Furthermore, it is possible to make the silicon oxide film 401 thicker thereby to reduce the parasitic capacitance of the lead conductor portion and to make the operating speed of the device higher by providing the collector lead conductor region on the support substrate side. Besides, lamination in this case is made between a polycrystalline silicon layer 450 and a silicon oxide film 100 by the direct bonding, and the device can be formed by applying a wafer on which silicon oxide films 401 and 402, a metal or a metallic compound 410 and the polycrystalline silicon layer 450 with the surface thereof flattened are formed in advance to the support 1 provided with a silicon oxide film 100 on the surface thereof.

Figure 11:
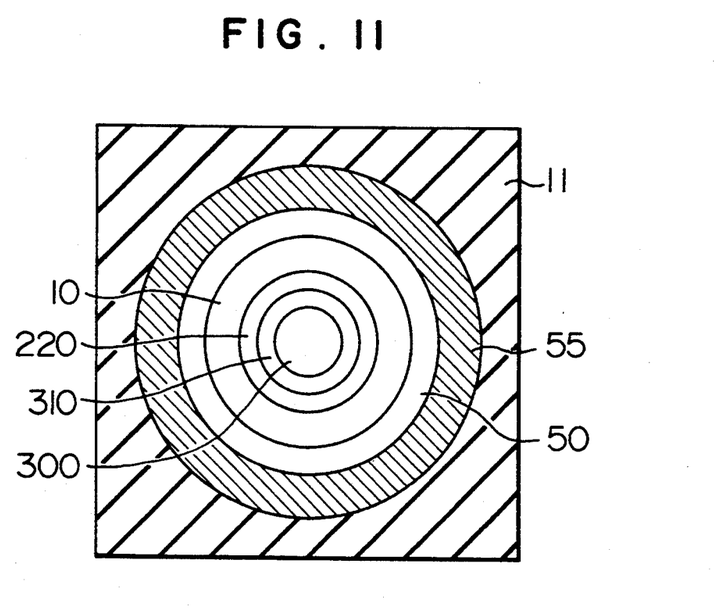
FIG. 11 is a plan view of a semiconductor device according to Embodiment 7 of the present invention.

FIG. 11 is a plan view of a semiconductor device according to Embodiment 7 of the present invention. In the present embodiment, a transistor is formed in a circle in a plan view, and an annular base region 220 is adjacent to an outside of an annular emitter region by forming such a planar structure. Thus, the operating speed is increased owing to a steep decrease of the density of electrons injected from the emitter region 310 into the base region 220, and thus the transit time in the base region is shortened, which makes it possible to increase the operation speed of the transistor. Furthermore, if the capacitance parasitic on the collector electrode of the transistor is assumed the same, it is possible to shorten the length of the locus of linearly emitted radiation due to the fact that the transistor is formed in a circle. Thus, the quantity of charges generated therefrom is reduced, and occurrence of soft errors can be suppressed. The sectional structure of this device may be made similar to that shown in FIG. 2A, for instance.

Figure 12:
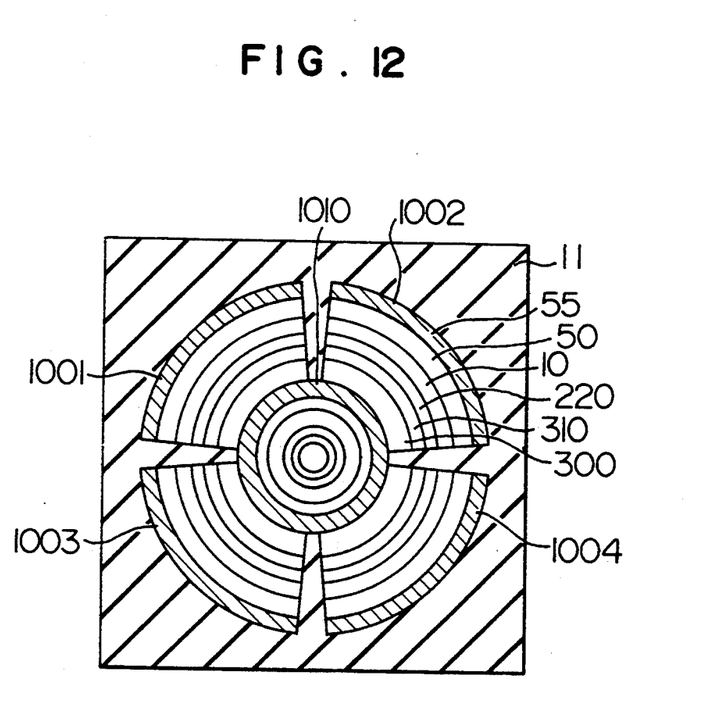
FIG. 12 is a plan view of a semiconductor device according to Embodiment 8 of the present invention.

FIG. 12 is a plan view of a semiconductor device according to Embodiment 8 of the present invention. In the present embodiment, transistors 1001, 1002, 1003 and 1004 each having a quarter circular arc shape are arranged concentrically in a plan view, and a transistor 1010 is arranged at the center thereof. The emitters of the transistors 1001, 1002, 1003 and 1004 are connected directly to the collector of the transistor 1010 without through connection layers by the method shown in Embodiment 3. Further, it is possible to form respective transistors to have a similar sectional structure to that shown in FIG. 2A, for instance. With this structure, an ECL circuit including, for example, the transistors 1001, 1002 and 1003 as input transistors, the transistor 1004 as a reference transistor, and the transistor 1010 as a current source transistor can be formed at a high integration. Besides, in the present embodiment, those transistors 1001, 1002 and 1003 which determine the operation speed and reliability of a circuit have a construction in which the operation speed is high and soft errors are hard to occur, as described with respect to Embodiment 7.

Figure 13A:
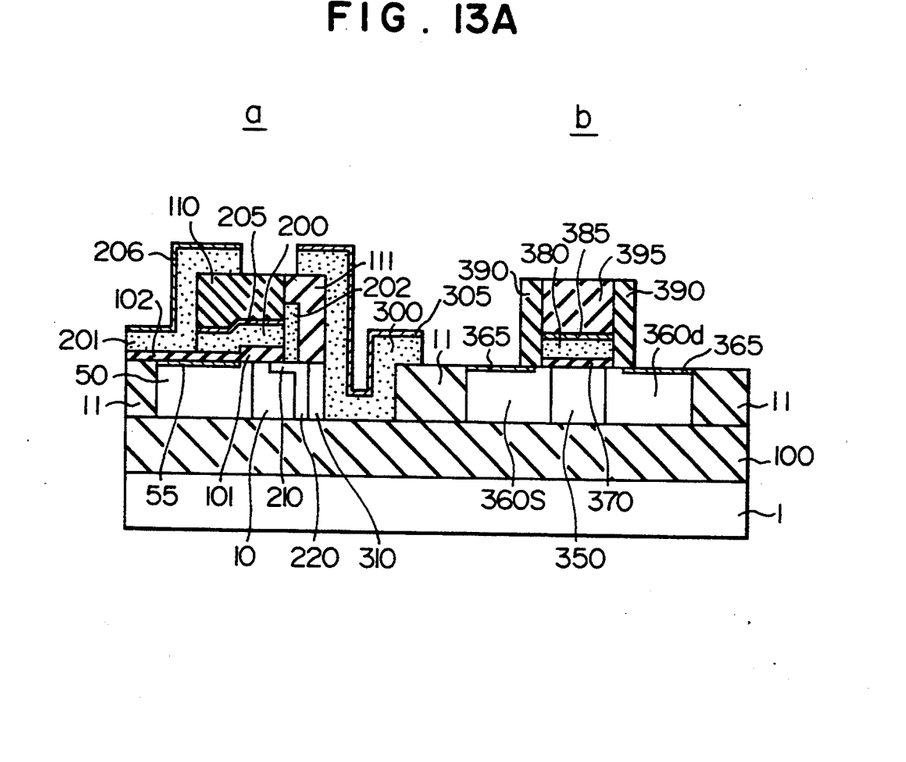
FIG. 13A is a sectional view of a semiconductor device according to Embodiment 9 of the present invention.
Figure 13B:
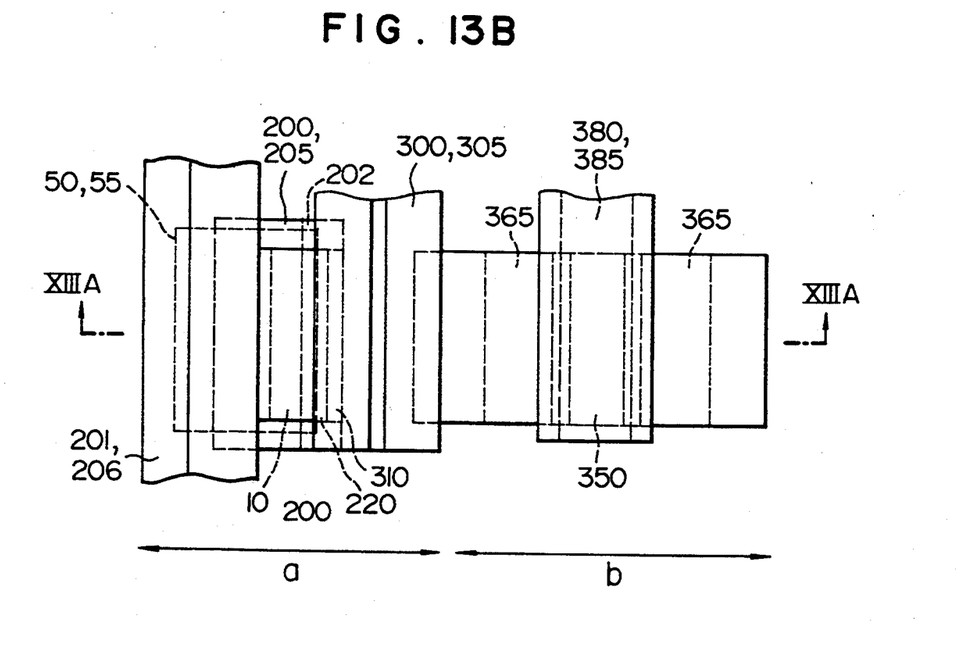

FIGS. 13A and 13B are sectional and plan views of a semiconductor device according to Embodiment 9 of the present invention. A bipolar transistor a and a MOS transistor a coexist in the present embodiment. The MOS transistor is an n-channel MOS transistor, and source/drain regions are formed of n-type regions 360s and 360d of a high impurity concentration being in contact with both ends of a p-type region 350. The MOS transistor can be miniaturized by reducing processing dimensions, thus making it possible to realize a high integration density. Furthermore, by forming a p-channel MOS transistor by performing p-type diffusion in the source/drain regions and using a CMOS circuit in a structure similar to the n-channel MOS transistor shown in the present embodiment, an integrated circuit of a low power consumption can be formed. Accordingly, by having a bipolar transistor and a MOS transistor miniaturized according to the present invention coexist, a high speed, highly integrated and low power integrated circuit can be realized. Incidentally, metallic compounds 365 and 385 are provided on respective surfaces of the n-type regions 360s and 360d of a high impurity concentration which serve as source/drain regions of a MOS transistor and a polycrystalline silicon layer 380 which serves as a gate electrode thereof. However, this is not the essence of the present invention, but no special restrictions are placed on the construction of the MOS transistor so far as required performance is obtainable. Further, a polycrystalline silicon layer and a metallic compound which serves as a gate electrode may be provided on the support side in such a manner as shown in Embodiment 6 shown in FIG. 10. Incidentally, reference numeral 370 represents a gate insulating film, and reference numerals 390 and 395 represent insulating layers composed of silicon oxide or the like.

Figure 14:
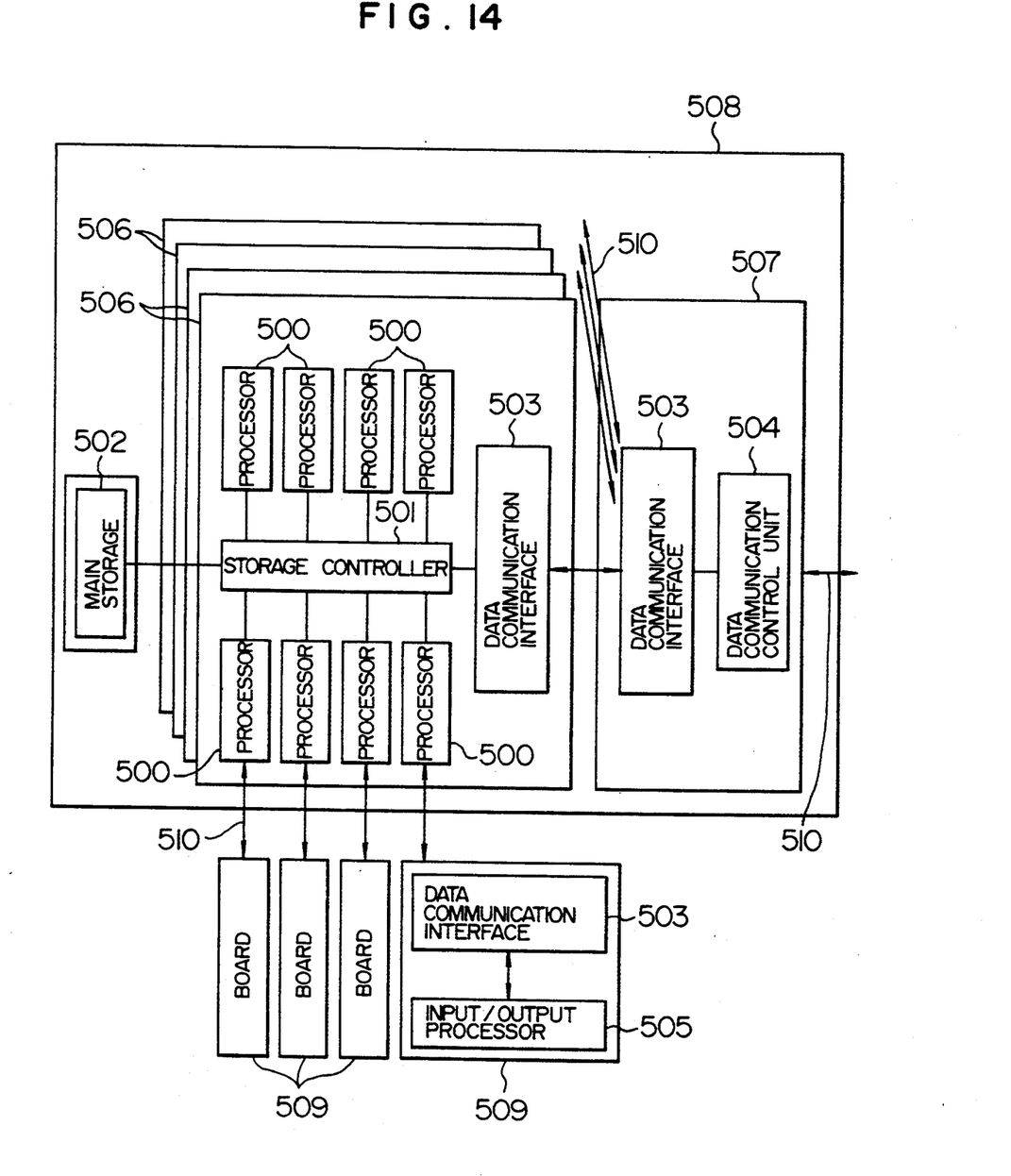
FIG. 14 is a block diagram of a computer for explaining Embodiment 1 of the present invention.

In the next place, Embodiment 10 will be described with reference to a computer block diagram shown in FIG. 14. The present embodiment is an example in which a silicon semiconductor integrated circuit with the present invention enforced is applied to a high speed large-scale computer wherein a plurality of processors 500 for processing instruction and operation are connected in parallel with one another. In the present embodiment, it is possible to form the processors 500 for processing instructions and operations, a storage controller 501, a main storage device 502 in the form of a silicon semiconductor chip having one side at approximately 10 to 30 mm since the integration level of the high speed silicon semiconductor integrated circuit with the present invention enforced is high. The processors 500 for processing these instructions and operations, the storage controller 501 and a data communication interface 503 composed of a compound semiconductor integrated circuit are mounted on a one ceramic substrate 506. Further, a data communication interface 503 and a data communication control unit 504 are mounted on a one ceramic substrate 507. A ceramic substrate on which these ceramic substrates 506 and 507 and a main storage 502 are mounted is placed on a substrate in a size having one side at approximately 50 cm or less so as to form a central processing unit 508 of a large-scale computer. Data communication in the central processing unit 508, data communication among a plurality of central processing units, or data communication among the data communication interfaces 503 and boards 509 on which input/output processors 505 are mounted is carried out through optical fibers 510 shown with double-headed arrows in the figure. In this computer, since silicon semiconductor integrated circuits such as the processor 500, the storage controller 501 and the main storage 502 for processing instructions and operations are operated in parallel at a high speed, and data communication is executed with light as a medium, it is possible to increase the number of instruction processing times per second to a great extent.

In above-described respective Embodiments 1 to 10, it is possible to combine several or all of them. Further, it is a matter of course that p-type and n-type may be used conversely in the respective embodiments.

We claim:

1. A semiconductor device comprising:

an electrically insulating substrate;

a semiconductor layer formed on said insulating substrate and having a main surface, said semiconductor layer having therein a plurality of semiconductor regions defined so as to be joined to each other to form at least two homojunctions in said semiconductor layer, said junctions generally extending in a first direction perpendicular to said insulating substrate and terminating at said main surface of said semiconductor layer, said plurality of semiconductor regions constituting said main surface, each of said plurality of semiconductor regions having a width in a second direction generally parallel to said insulating substrate, a first semiconductor region among said plurality of semiconductor regions having an expanded area at said main surface of said semiconductor layer such that a width of said first semiconductor region in said expanded area at said main surface is larger than a width of said first semiconductor region below said expanded area, and a second semiconductor region joined to said first semiconductor region and having an end surface constituting one end of said semiconductor layer;

a first lead conductor in contact with said first semiconductor region at said main surface of said semiconductor layer for electrical connection therebetween, said first lead conductor including at least a first conductor layer and a second conductor layer, said first conductor layer being physically and electrically in contact with and extending from said expanded area of said first semiconductor region substantially perpendicularly thereto, wherein an area of contact between said first conductor layer and said expanded area of said first semiconductor region is smaller than an area of said expanded area at said main surface of said semiconductor layer, and said second conductor layer extending over that portion of said semiconductor layer which contributes to definition of at least one of said semiconductor regions other than said first semiconductor region;

a second lead conductor in contact with said second semiconductor region at said one end; and an insulating film having a portion provided over said second semiconductor region separating said first lead conductor from said second lead conductor, said portion having an end surface aligned with said end surface of said second semiconductor region.

2. A semiconductor device according to claim 1, in which each of said first and second lead conductors is made of a doped polysilicon.

3. A semiconductor device according to claim 1, in which a third semiconductor region constitutes a second end of said semiconductor layer opposite said one end and serving as a third lead conductor for a fourth semiconductor region joined with said third semiconductor region.

4. A semiconductor device according to claim 3, in which a metallic layer is formed on at least a part of each of said third semiconductor region and said first and second lead conductors.

5. A semiconductor device according to claim 4, in which the metallic layer formed on said third semiconductor region is divided to provide a portion of said third semiconductor region which is not covered with said metal layer so that said portion of said third semiconductor region serves as a resistor connected to said third semiconductor region.

6. A semiconductor device according to claim 3, in which said first, second, fourth semiconductor regions are base, emitter and collector regions of a bipolar transistor, respectively.

7. A semiconductor device according to claim 3, wherein a fifth region made of a single-crystal semiconductor layer of the second conductive type connected to said first electrode lead region is provided on said substrate surface.

8. A semiconductor device according to claim 7, wherein a metal or a metallic compound is provided at least at a part of the surface of said fifth region.

9. A semiconductor device according to claim 3, wherein a bipolar transistor is comprised of said first region serving as an emitter region, said second region serving as a base region, said third and fourth regions serving as a collector region, and said first electrode lead region serving as a base lead electrode.

10. A semiconductor device comprising:

an electrically insulating substrate;

a semiconductor layer formed over said insulating substrate with an insulating layer being interposed therebetween, said semiconductor layer having a main surface and having a plurality of semiconductor regions defined so as to be joined to each other to form at least two homojunctions in said semiconductor layer, said junctions generally extending in a direction perpendicular to said insulating substrate and terminating at said main surface of said semiconductor layer, said plurality of semiconductor regions constituting said main surface;

a first lead conductor in contact with a first one of said semiconductor regions at said main surface of said semiconductor layer for electrical connection therebetween and extending over that portion of said semiconductor layer which contributes to definition of at least one of said semiconductor regions other than said first semiconductor region, said first semiconductor region serving to form two homojunctions with semiconductor regions joined thereto, a second one of said semiconductor regions constituting one end of said semiconductor layer while a third one of said semiconductor regions constituting a second end of said semiconductor layer opposite said one end and serving as a third lead conductor for a fourth one of said semiconductor regions joined with said third semiconductor region; and a connection conductor formed in said insulating layer and in contact with said third semiconductor region at a surface of said semiconductor layer opposite to said main surface for electrical connection therebetween.

11. A semiconductor device comprising:

an electrically insulating substrate;

a first semiconductor island formed on said insulating substrate and having a main surface, said first semiconductor island having therein first, second, third and fourth semiconductor regions defined so as to be joined to each other to form homojunctions in said first semiconductor island, said junctions generally extending in a direction perpendicular to said insulating substrate and terminating at said main surface of said first semiconductor island, said semiconductor regions constituting said main surface, each of said plurality of semiconductor regions having a width in a second direction generally parallel to said insulating substrate, a first semiconductor region among said plurality of semiconductor regions having an expanded area at said main surface of said semiconductor layer such that a width of said first semiconductor region in said expanded area at said main surface is larger than a width of said first semiconductor region below said expanded area, said second and third semiconductor regions constituting first and second ends of said first semiconductor island, respectively;

a first lead conductor in contact with said first semiconductor region at said main surface of said first semiconductor island for electrical connection therebetween, said first lead conductor including at least a first conductor layer and a second conductor layer, said first conductor layer being physically and electrically in contact with and extending from said expanded area of said first semiconductor region substantially perpendicularly thereto, wherein an area of contact between said first conductor layer and said expanded area of said first semiconductor region is smaller than an area of said expanded area at said main surface of said semiconductor layer, and said second conductor layer extending over that portion of said first semiconductor island which contributes to definition of sat least one of said second, third and fourth semiconductor regions;

a second lead conductor in contact with said first end of said first semiconductor island for electrical connection with said second semiconductor region;

an insulating film having a portion provided over said second semiconductor region separating said first lead conductor from said second lead conductor, said portion having an end surface aligned with said end surface of said second semiconductor region;

a second semiconductor island formed on said insulating substrate and having a main surface, said second semiconductor island having therein fifth and sixth semiconductor regions spaced distance from each other to define a channel region therebetween in said second semiconductor island, said fifth and sixth semiconductor regions contributing to constitution of said main surface of said semiconductor island, said firth and sixth semiconductor regions constituting first and second ends of said second semiconductor island, respectively; and a control electrode layer formed over said main surface of said second semiconductor island between said fifth and sixth semiconductor regions, with a control electrode insulating film interposed between said control electrode layer and said main surface of said second semiconductor island.

12. Semiconductor device produced by a method comprising the steps of:

preparing a semiconductor substrate having an insulating layer on one surface thereof;

forming a stepped insulating film having a first film portion of a relatively small thickness and a second film portion of a relatively large thickness adjacent to each other with a step on the other surface of said semiconductor substrate;

forming a first conductive film so as to cover said step and a part of said first film portion and a part of said second film portion;

introducing a first impurity of a first conductivity type through said first film portion of said stepped insulating film into said other surface of said semiconductor substrate using said first conductive film and said second film portion of said stepped insulating film as a mask to form a third semiconductor region in said semiconductor substrate;

removing that part of said second film portion of said stepped insulating film which is not covered by said first conductive film to partly expose said other surface of said semiconductor substrate;

forming a second conductive film so as to be in contact with said first conductive film and said exposed part of said other surface of said semiconductor substrate;

forming an oxide film on said second conductive film by thermal oxidation, said oxide film also covering a part of said exposed part of said other surface of said semiconductor substrate;

removing the resulting exposed part of said semiconductor substrate to define one end of said semiconductor substrate and to partly expose said insulating layer;

introducing a second impurity of a second conductivity type into said one end of said semiconductor substrate to a first predetermined distance to define a fourth semiconductor region adjacent to said third semiconductor region;

forming a polysilicon film doped with a third impurity of the first conductivity type in contact with said one end of said semiconductor substrate into which said second impurity has been introduced; and introducing said third impurity from said polysilicon film into said one end of said semiconductor substrate to a second predetermined distance to define a second semiconductor region of the first conductivity type at said one end of said semiconductor substrate and a first semiconductor region of the second conductivity type between said fourth and second semiconductor region, said second predetermined distance being smaller than said first predetermined distance.

13. A semiconductor device comprising:

an insulating substrate;

a first region made of a single-crystal semiconductor layer of a first conductive type provided on a surface of said substrate and having first and second side surfaces;

a second region made of a single-crystal semiconductor layer of a second conductive type opposite to the first conductive type provided on the surface of said substrate, said second region being in contact with said first side surface of said first region, said second region having an enlarged area at an upper surface thereof such that a width between opposing sides of said second region in said enlarged area is larger than a width of said second region below said enlarged area;

a third region made of a single-crystal semiconductor layer of a first conductive type provided on said substrate surface, said third region being in contact with a side of said second region;

a fourth region made of a single-crystal semiconductor layer of the first conductive type provided on said substrate surface, said fourth region being in contact with a side of said third region;

a first electrode lead region made of a single-crystal semiconductor layer or a polycrystalline semiconductor layer connected to said second region, wherein a first portion of said first electrode lead region is physically and electrically in contact with and extends from said expanded area of said second region substantially perpendicular thereto, an area of contact between said first portion and said expanded area being smaller than an area of said expanded area, and wherein a second portion of said first electrode lead region extends over said fourth region through an insulator layer;

a second electrode lead region connected to said second side surface of said first region; and an insulating film having portion provided over said first region separating said first electrode lead region from said second electrode lead region, said portion having an end surface aligned with said second side surface of said first region.

14. A semiconductor device according to claim 13, wherein a second electrode lead region made of a single-crystal semiconductor layer or a polycrystalline semiconductor layer of the first conductive type connected to said first region is provided, and said second electrode lead region is connected to said first region on the side of said first region.

15. A semiconductor device according to claim 13, wherein respective upper faces of said first region, said second region, said third region and said fourth region form approximately one plane.

16. A silicon-on-insulator bipolar transistor, comprising:

a substrate, at least an upper major surface of which is electrically insulating;

a semiconductor layer provided on said upper major surface of said substrate, said semiconductor layer having an emitter region of a first conductivity type, a base region of a second conductivity type opposite said first conductivity type provided adjacent said emitter region in a first direction generally parallel to said upper major surface, and a collector region of said first conductivity type provided adjacent said base region in said first direction, junctions between said base region and said emitter region and between said base region and said collector region extending from said upper major surface of said substrate towards an upper surface of said semiconductor layer generally in a second direction perpendicular to said upper major surface of said substrate, said base region having an expanded area at said upper surface of said semiconductor layer such that a width in said first direction of said base region in said expanded area is greater than a width in said first direction of said base region below said expanded area, and said emitter region having a side surface constituting an end of said semiconductor layer;

a base lead conductor in electrical contact with said base region, said base lead conductor including a first portion in physical and electrical contact with said expanded area of said base region and extending from said expanded area at said upper surface generally in said second direction perpendicular to said upper major surface of said substrate, said first portion having a width in said first direction narrower than said width of said expanded area, and a second portion in physical and electrical contact at one end with said first portion and extending over and generally parallel with said upper surface of said semiconductor layer beyond said base region and being separated from said semiconductor layer by an insulating layer;

an emitter lead conductor in physical and electrical contact with said side surface of said emitter region;

a collector lead conductor in physical and electrical contact with said collector region; and an insulating film having a portion provided over said emitter region separating said emitter lead conductor from said base lead conductor, said portion having an end surface aligned with said side surface of said emitter region.

17. A silicon-on-insulator bipolar transistor according to claim 16, wherein a contact area between said emitter region and said emitter lead conductor extends in said second direction perpendicular to said upper major surface of said substrate.

18. A silicon-on-insulator bipolar transistor according to claim 16, wherein said collector lead conductor comprises a portion of said semiconductor layer provided adjacent said collector region in said first direction.

19. A silicon-on-insulator bipolar transistor according to claim 18, wherein said emitter lead conductor and said base lead conductor comprise polycrystalline silicon.

20. A silicon-on-insulator bipolar transistor according to claim 18, wherein said second portion of said base lead electrode extends over said collector region and a portion of said collector lead conductor.

21. A semiconductor device comprising:

an electrically insulating substrate;

a semiconductor layer formed on said insulating substrate and having a main surface, said semiconductor layer having therein at least first, second and third semiconductor regions defined so as to be joined to each other to form at least two homojunctions in said semiconductor layer, said junctions generally extending in a first direction perpendicular to said insulating substrate and terminating at said main surface of said semiconductor layer, said at least first, second and third semiconductor regions constituting said main surface, said second semiconductor region having a side surface constituting one end of said semiconductor layer;

a first lead conductor in contact with a first one of said semiconductor regions at said main surface of said semiconductor layer for electrical connection therebetween, said first lead conductor including at least a first conductor layer and a second conductor layer, said first conductor layer being physically and electrically in contact with and extending from said first semiconductor region substantially in said first direction, said second conductor layer extending over that portion of said semiconductor layer which contributes to definition of at least one of said semiconductor regions other than said first semiconductor region;

a second lead conductor in contact with said second semiconductor region at said one end; and an insulating film having a portion provided over said second semiconductor region separating said first lead conductor from said second lead conductor, said portion having an end surface aligned with said end surface of said second semiconductor region.

22. An electronic computer having a central processing unit and a peripheral equipment, said central processing unit including a main storage, information processors coupled to said main storage and operable under control of a storage controller, in which each of said information processors and said storage controller includes a semiconductor device defined in claim 21.

* * * * *